United States Patent [19]
Oh et al.

[11] Patent Number: 5,895,930
[45] Date of Patent: Apr. 20, 1999

[54] INFRARED PHOTODETECTOR WITH DOPING SUPERLATTICE STRUCTURE

[75] Inventors: Eung-Gie Oh; Jeon-Wook Yang; Chul-Soon Park; Kwang-Eui Pyun, all of Daejeon, Rep. of Korea

[73] Assignee: Electronics and Telecommunications Research Institute, Daejeon, Rep. of Korea

[21] Appl. No.: 08/891,495

[22] Filed: Jul. 11, 1997

[30]  Foreign Application Priority Data

Dec. 12, 1996 [KR] Rep. of Korea ............... 96-64945

[51] Int. Cl.$^6$ ................................................ H01L 29/06
[52] U.S. Cl. .................... 257/21; 257/15; 257/458; 257/459; 257/462
[58] Field of Search ............................ 257/15, 17, 21, 257/197, 458, 462, 459

[56]  References Cited

U.S. PATENT DOCUMENTS

| | | | |
|---|---|---|---|
| 5,272,356 | 12/1993 | Wen et al. | 257/432 |
| 5,477,060 | 12/1995 | Choi | 257/15 |
| 5,506,419 | 4/1996 | Levine et al. | 257/17 |

OTHER PUBLICATIONS

G.H. Döhler et al., "Observation of Tunable Band Gap and Two-Dimensional Subbands in a Novel GaAs Superlattice", Physical Review Letters, vol. 47, No. 12, Sep. 21, 1981, pp. 864–867.

C.J. Chang–Hasnain et al., "Tunable Electroabsorption and Electroluminescence in GaAs doping Superlattices", SPIE vol. 792 Quantum Well and Superlattice Physics 1987, pp. 45–49, 1987.

B.F. Levine et al., "Broadband 8–12 μm high-sensitivity GaAs quantum well infrared photodetector", Appl. Phys. Lett. 54, Jun. 26, 1989, pp. 2704–2706.

*Primary Examiner*—Minh Loan Tran
*Attorney, Agent, or Firm*—Jacobson, Price, Holman & Stern, PLLC

[57]  ABSTRACT

This invention provides infrared sensing photodetector and a method therefor which provides a structure for effectively absorbing a light incident in a normal direction on a substrate, and a method compatible with existing processes for making integrated circuitry. An infrared sensing photodetector includes a compound semiconductor substrate of a first conductivity type, superlattice areas having implanted impurity ions of a second conductivity type opposite to the compound semiconductor substrate, each being spaced a predetermined distance each other in a selected region of the semiconductor substrate, a first collector area and a first emitter area which are formed in both end portions positioned perpendicular relative to the doped superlattice areas, a first collector electrode and a first emitter electrode formed on the first collector area and the first emitter area, respectively, a second collector area and a second emitter area which are spaced a predetermined distance in a horizontal direction on the doped superlattice area, and a second collector electrode and a second emitter electrode formed on the second collector area and the second emitter area, respectively.

4 Claims, 3 Drawing Sheets

INFRARED PHOTODETECTOR WITH DOPING SUPERLATTICE STRUCTURE

BACKGROUND OF THE INVENTION

1. Field of the Invention

The present invention relates to an infrared photodetector and method thereof, and more specifically to an infrared photodetector using doping superlattice structure with improved photo-sensitivity and method thereof.

2. Description of the Prior Art

In general, infrared semiconductor devices are used in many practical applications such as communications, security systems, and other modern electronic devices. In many of these applications, the sensitivity of the infrared photodetector is critical to its application.

Accordingly, there have been many advances in the use of semiconductor and transistor structures for detecting infrared radiation or light. Many of these advances have resulted in faster, more responsive detectors, as well as detectors capable of detecting multi-color infrared radiation.

Recently, multiple quantum well (MQW) photodetectors using heterojunction superlattice structure of compound semiconductors have been developed One such detector is disclosed in U.S. Pat. No. 5,272,356 issuing to Wen on Dec. 21, 1993, and entitled "MQW Photodetector for Normal Incident Radiation".

However, infrared photodetector with doping superlattice structure have not yet found widespread commercial use.

The doping superlattice structure-consists of ultrathin n- and p-type doped layer, possibly separated by intrinsic layers (n-i-p-i crystal). These doped superlattice exhibit novel electronic properties which result from a very efficient spatial separation between electron and hole subbands (indirect gap in real space) by the periodic space-charge potential. This separation implies recombination lifetimes which may be increased by many orders of magnitude over those of bulk material. Consequently, large deviations of the electron and hole concentration from thermal equilibrium are metastable under weak excitation conditions.

In addition, the space-charge-induced superlattice potential itself is strongly affected by a variation of the electron and hole concentration. The effective energy gap of a n-i-p-i crystal as well as the structure of the dimensional (2D) subband should thus no longer be fixed material parameters but tunable quantities.

The basic electron and optical properties of the doping superlattice structure (n-i-p-i crystal) are tunable as a consequence of the spatially indirect bandgap which can be varied with optical or electrical excitation. The absorption coefficient of a semiconductor at photon energies below the bandgap increases in the presence of an electric field.

In a n-i-p-i crystal, a large electric field is built in due to the ionized impurities. Hence, by varying the effective bandgap which varies the electric field, the absorption coefficient and the conductivity can be tuned. Using these properties, infrared photodetector is manufactured.

FIG. 1 shows a cross-sectional view of the infrared photodetector with doping superlattice structure according to a prior art. This device includes a substrate 1, a p+ emitter layer 2, doped superlattice layers 3, an N+ collector layer 4, an emitter electrode 5, and a collector electrode 6.

A configuration of the conventional photodetector made according to the conventional method is such that the quantum wells provided in the superlattice areas are arranged in a horizontal manner, therefore it is difficult for any incident light in a normal direction on the substrate to be absorbed in the superlattice areas.

To overcome such a problem, there has been used a substrate having an etched mesa structure suitable for absorbing more light incident in a normal direction, or a prism type of flat plate acting to change a propagating path of the incident light.

However, these configurations adopted to moderate the problem requires to use considerably expensive equipment, such as metal organic chemical vapor deposition (MOCVD) or molecular beam epitaxy (MBE), to be used for making the desired superlattice structure, which therefore increases in a manufacturing cost.

Further, since the structures made advantageously do not exhibit a satisfactory absorption feature of the light incident in a normal direction, the structures further necessitate another auxiliaries separately provided thereto for an effective absorption of the incident light, moreover not compatible with existing processes for fabricating the required integrated circuits, making it difficult to integrate the conventional structure together with other integrated circuitry.

SUMMARY OF THE INVENTION

Accordingly, it is an object of the present invention to provide an infrared sensing photodetector and a method therefor which with relatively reduced manufacturing cost, provides a structure capable of effectively absorbing a light incident in a normal direction on a substrate, and a method compatible with various existing processes for making any integrated circuitry.

To achieve the above objects, there is provided an infrared sensing photodetector comprising a compound semiconductor substrate of a first conductivity type; superlattice areas having implanted impurity ions of a second conductivity type opposite to the compound semiconductor substrate, each being spaced a predetermined distance each other in a selected region of the semiconductor substrate; a first collector area and a first emitter area which are formed in both end portions positioned perpendicular relative to the doped superlattice areas; a first collector electrode and a first emitter electrode formed on the first collector area and the first emitter area, respectively; a second collector area and a second emitter area which are spaced a predetermined distance in a horizontal direction on the doped superlattice area; and a second collector electrode and a second emitter electrode formed on the second collector area and the second emitter area, respectively.

The photodetector according to the present invention is further characterized in that said compound semiconductor substrate comprises a p-type GaAs substrate.

Moreover, the conductivity of impurity opposite to that of the compound semiconductor substrate may comprise silicon ions.

Still further, the photodetector as defined above may use the silicon ions in forming the doped superlattice areas, which are implanted with a distance spaced by about 1000 angstroms.

According to another aspect of the present invention, there is provided a method for fabricating an infrared sensing photodetector, the method comprising the steps of: forming an epitaxial layer on a compound semiconductor substrate; forming a protective layer for preventing any damages in the epitaxial layer due to an etchant used in performing photolithography processing so as to form ultra-fine pattern on the epitaxial layer; forming a photoresist pattern for defining a doped superlattice area, a first emitter area, and first and second collector areas over the resultant structure; selectively etching the protective layer using the photoresist pattern as a mask in etching; selectively etching the epitaxial layer using both the protective layer and photoresist pattern as a mask in etching; implanting impurity ions of conductivity opposite of that of the compound semiconductor substrate using the epitaxial layer, protective layer and photoresist pattern as a mask so as to define the doped superlattice area, the first emitter area and the first and second collector areas; removing the epitaxial layer, protective layer and photoresist pattern; implanting ion using a predetermined mask pattern to define the second emitter area; and forming first and second emitter electrodes and first and second collector electrodes.

The method as defined above is further characterized in that the compound semiconductor substrate comprises a GaAs substrate.

Alternatively, the compound semiconductor substrate may selectively comprise an InP substrate or a GaSb substrate.

Further, for the method as defined above, the epitaxial layer may comprise any one of an AlGaAs layer, InGaAs layer, InAlAs layer, InAlAsP layer, GaAlSb layer, or InAsSb layer.

Still further, the method as defined above uses the protective layer comprising any selected one of aluminum layer, W layer, Au layer, silicon oxide layer, silicon nitride layer, or silicon oxide nitride layer.

Still further, for the method as defined above, the pattern of photoresist is formed to have a thickness of about 2000 angstroms.

The present invention takes a configuration of a structure having multi-quantum wells arranged and located in a vertical manner relative to the substrate, in other words doped superlattice being in a vertical fashion relative to a semiconductor substrate, such that a light incident upon the substrate in a normal direction is efficiently absorbed regardless of polarization of the incident light of the normal direction.

BRIEF DESCRIPTION OF THE DRAWINGS

The present invention will become more fully understood to following detailed description taken in conjunction with the accompanying drawings, wherein.

DETAILED DESCRIPTION OF THE INVENTION

The preferred embodiment according to the present invention will now be described in detail in accordance with the accompanying drawings.

According to the present invention, there is provided a structure for infrared photodetector whose multi-quantum wells are arranged in a vertical fashion relative to a substrate, whereby a light incident in a normal direction on the substrate is efficiently absorbed regardless of polarization of the incident light.

For such purposes, the present invention forms superlattice structure vertically located with respect to the substrate through the use of fine-pattern and ion implantation. Concentrations of p- and n-type layers in doped superlattice structure are determined by conditions of ion implantation process, and a period of the superlattice structure is determined by thicknesses of the p- and n-type layers therefor, preferably such that the period range is within 1000 angstroms.

In order to form two layers as mentioned above having the defined thickness by using ion implantation process, it is required to form a fine-pattern. The present invention employs E-beam direct writing approach or interfering exposure approach so as to form the desired fine-pattern over a prepared photoresist, wherein the used photoresist preferably has a thickness of about 2000 angstroms suitable for forming a minimum, optimum fine-pattern. Considering the difficulty in using such thinner photoresist film as a mask against an ion implantation, another epitaxial and protective layers are further added for a complement.

The epitaxial layer serves as a protecting layer during ion implantation process, further a thickness of the quantum well in which electrons are trapped (area being not subjected to n-type ion implantation) is adjusted by means of a thickness of the epitaxial layer. The epitaxial layer is further used to remove the fine-pattern formed after ion implantation by a selective etching method by which the epitaxial layer is faster etched away than the substrate due to different etch rates between the epitaxial layer and the substrate. Accordingly, the larger difference of the etch rates is preferable.

Figure 1:
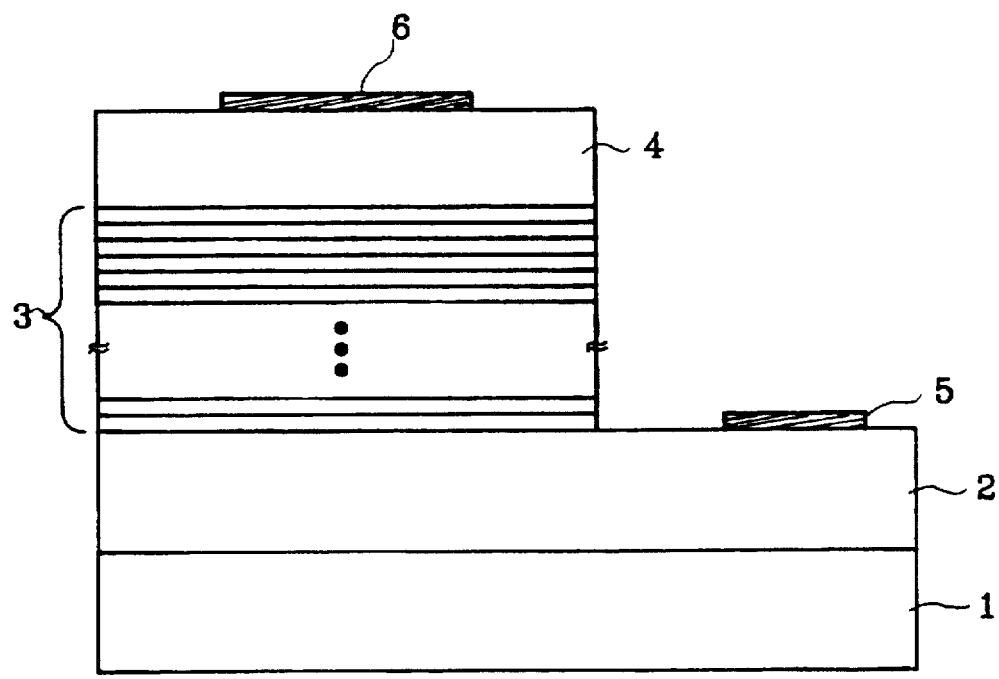
FIG. 1 shows a sectional view of a conventional photodetector.
Figure 2:
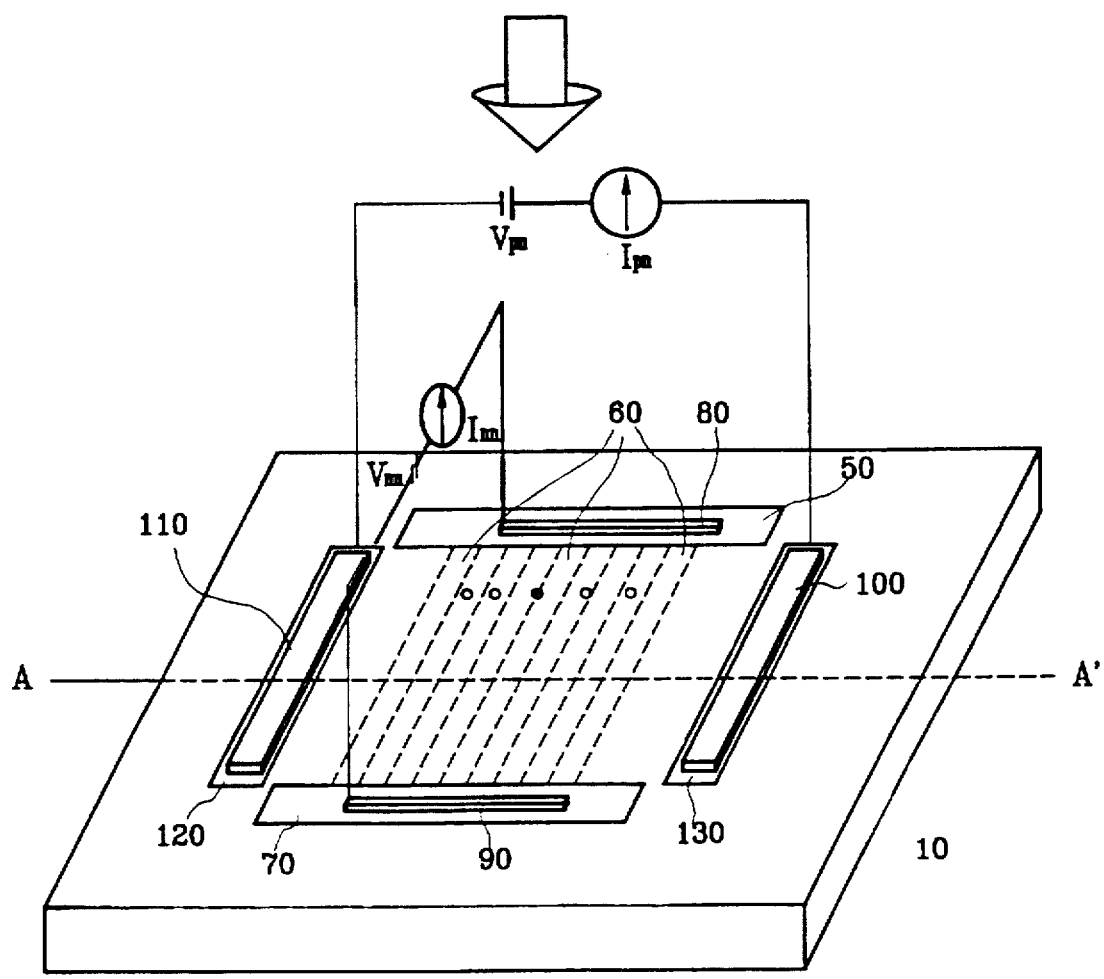
FIG. 2 shows a perspective view of infrared photodetector in accordance with one embodiment of the present invention.

FIG. 2 shows a perspective view of infrared photodetector in accordance with one embodiment of the present invention. With electric potential $V_{pn}$ applied between a second emitter electrode 100 and a second collector electrode 110, incident radiation delivered to doped superlattice area is absorbed into the area, whereby hole-electron pairs are generated at there. The generated hole-electron pairs experience a transition to the lowest level, where electrons are trapped in quantum wells provided in P-type semiconductor layer. This increases in conductivity in areas comprising those quantum wells. Accordingly, the detection of an incident light can be achieved by a varying amount of current $I_{nn}$ flowing between a first emitter electrode 90 and a first collector electrode 80.

Figure 3A:
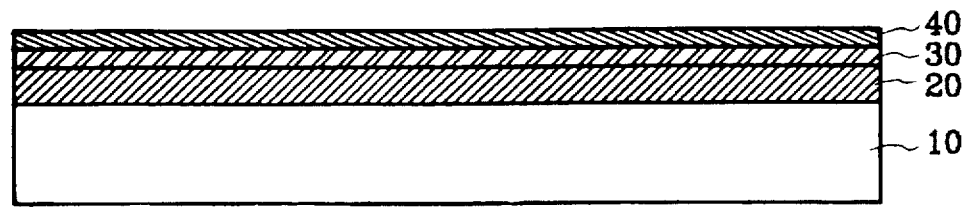
FIGS. 3A to 3C are the process sectional views taken along A-A' line in FIG. 2, which illustrate the sequential processes for fabricating infrared photodetector in accordance with one embodiment of the present invention.
Figure 3B:
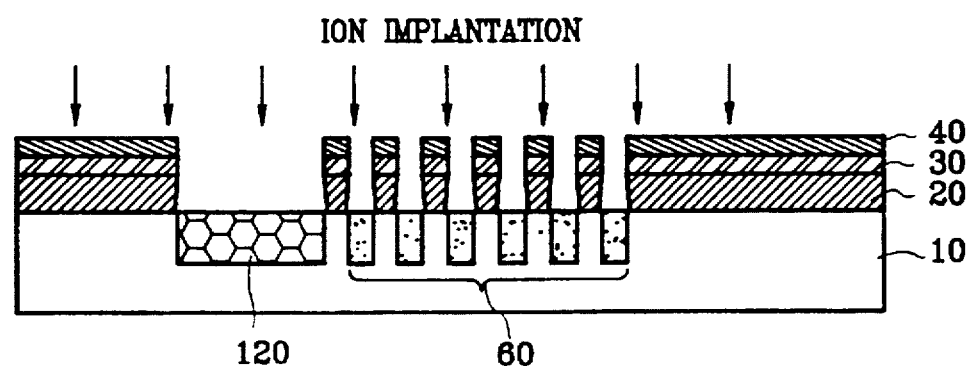
Figure 3C:
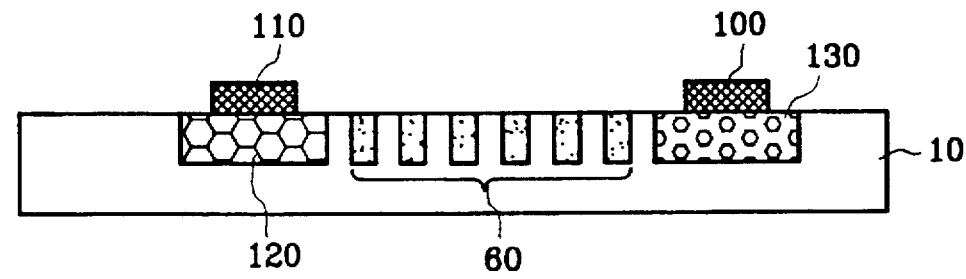

FIGS. 3A to 3C are the process sectional views taken along A-A' line in FIG. 2, which illustrate the sequential processes for fabricating infrared photodetector in accordance with one embodiment of the present invention.

As shown in FIG. 3A, p-type GaAs-based semiconductor substrate 10 is prepared which may be formed by either implantation of p-type impurities or an epitaxial growth method. On an upper surface of the p-type GaAs substrate 10 is grown an AlGaAs epitaxial layer 20.

After growth of the AlGaAs layer 20, a protective layer 30 of aluminum is formed thereon in order to prevent any damages in the AlGaAs epitaxial layer 20, which may occur during well-known photolithography process due to an etchant attack to the AlGaAs epitaxial layer 20 while patterning the AlGaAs epitaxial layer 20. For patterning, photoresist film 40 of about 2000 angstroms thickness is formed over an overall structure having a top layer of the protective layer 30.

Further, the epitaxial layer and protective layer, together with the photoresist, serve as mask against ion implantation. It is noted that although the protective layer comprises an aluminum layer, any one of a metallic or insulating layer may be, instead, employed which comprises W, Au, etc., or silicon-nitride layer, silicon-oxide layer, or silicon-oxide-nitride layer. Still further, the p-type GaAs substrate 10 may be prepared by implanting p-type impurity ions into a GaAs substrate.

Alternatively, there may be employed a structure having a p-type InP layer as a substrate and a compound semiconductor layer, such as, InGaAs, InAlAs, InAlAsP, etc. as an epitaxial layer formed thereon, theses layers being mated with each other in lattice matched structure, or another structure having a p-type GaSb layer as a substrate and a compound semiconductor layer, such as, GaAlSb, InAsSb, etc. as an epitaxial layer formed thereon, theses layers also being mated with each other in lattice matched structure, similarly.

Subsequently, an overall structure is coated with a photoresist having a thickness of about 2000 angstroms, which is subjected to patterning process for defining an n-type semiconductor area 60 of superlattice structure, a first low-resistance collector area 50 in FIG. 2, a second low-resistance collector area 120 and a first low-resistance emitter area 70 in FIG. 20.

This patterning may be conducted by interfering exposure method using a mask with a predetermined, delineated pattern, or by directly illuminating e-beam without any mask. The patterned photoresist 40 is then used as a mask in etching an underlying aluminum layer 30. Using two layers 30 and 40 of the patterned photoresist and underlying aluminum as another mask against a subsequent etching step, an etch of the AlGaAs epitaxial layer 30 continues until an underlying p-type GaAs substrate 10 appears.

Next, as shown in drawing, the second low-resistance collector area 120, the doped superlattice area 60, the first low-resistance collector area and first low-resistance emitter area (not shown) are formed, respectively, through an ion implantation of n-type impurity, such as, Si for the p-type GaAs substrate 10 using the AlGaAs epitaxial layer 20, aluminum layer 30 and photoresist 40 previously patterned as a mask gainst the ion implantation.

At this time, the pattern in the photoresist 40 should be of ultra-fine pattern enough to obtain superlattice area 60 doped with n- and p-type, respectively, having a period of about 1000 angstrom ranges. The thickness of the photoresist is dependent upon capability of photolithography process currently available in forming ultra-fine pattern in the photoresist.

Referring to FIG. 3C, the used AlGaAs epitaxial layer 20, aluminum layer 30, and patterned photoresist 40 are wholly removed to leave the p-type GaAs substrate 10 exposed, whereby the p-type second low-resistance emitter area 130 is defined. Then, after an ion implantation of p-type impurity such as Be or Mg, followed by a Rapid Thermal Annealing for an activation of the implanted impurities, there are formed a first emitter electrode(not shown), a second emitter electrode 100, a first collector electrode(not shown) and a second collector electrode 110.

The infrared photodetector thus constructed may be fabricated into the substrate in which other devices, such as, a metal semiconductor field effect transistor, high electron mobility transistor, hetero junction bipolar transistor, etc., for constituting any intended integrated circuitry are also fabricated therewith.

The present invention takes a configuration of doped superlattice structure obtained through the use of the fine pattern and through an ion implantation using the pattern as a mask, the structure being located in a vertical fashion relative to the semiconductor substrate, which is permitted for an easy absorption of a light incident upon the semiconductor substrate in normal direction. Moreover, the method of the present invention allows the photodetector to enable an easy fabrication thereof in even any selected place on the semiconductor substrate.

In addition, the method provided in this invention is completely compatible with any method for making a monolithic microwave integrated circuit using well-known field effect transistors, therefore provides an advantage of the possibility of integrating the devices of the present invention as well as other integrated circuitry.

While the present invention has been described with respect to certain preferred embodiment only, other modifications and variations may be made without departing from the scope of the present invention as set forth in the following claims.

What is claimed is:

1. An infrared sensing photodetector with doping superlattice structure comprising:

a compound semiconductor substrate of a first conductivity type, superlattice areas having implanted impurity ions of a second conductivity type opposite to said first conductivity type of the compound semiconductor substrate, each of the superlattice areas being spaced a predetermined distance from each other in a selected region of the semiconductor substrate;

a first collector area and a first emitter area which are formed at both end portions of the compound semiconductor substrate and positioned perpendicular relative to the doped superlattice areas;

a first collector electrode and a first emitter electrode formed on the first collector area and the first emitter area, respectively;

a second collector area and a second emitter area which are spaced a predetermined distance in a horizontal direction on the doped superlattice areas; and a second collector electrode and a second emitter electrode formed on the second collector area and the second emitter area, respectively.

2. The photodetector as defined in claim 1, wherein the compound semiconductor substrate comprises a p-type GaAs substrate.

3. The photodetector as defined in claim 2, wherein the conductivity of impurity opposite to that of the compound semiconductor substrate comprises silicon ions.

4. The photodetector as defined in claim 3, wherein the silicon ions used in forming the doped superlattice areas are implanted so that the spaced distance between each superlattice are is about 1000 angstroms.

* * * * *